(12) United States Patent
Wada et al.

(10) Patent No.: US 6,242,786 B1
(45) Date of Patent: Jun. 5, 2001

(54) SOI SEMICONDUCTOR DEVICE WITH FIELD SHIELD ELECTRODE

(75) Inventors: Yoshiki Wada; Hirotada Kuriyama; Kimio Ueda; Koichiro Mashiko; Hiroaki Suzuki, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/213,280

(22) Filed: Dec. 17, 1998

(30) Foreign Application Priority Data

Jul. 13, 1998 (JP) .................................. 10-197686

(51) Int. Cl.$^7$ ............................................. H01L 29/40
(52) U.S. Cl. .................... 257/488; 257/452; 257/493; 257/494; 257/495
(58) Field of Search ........................ 257/368, 357, 257/495, 504, 493, 494, 544, 508, 509, 500, 519, 452, 488

(56) References Cited

U.S. PATENT DOCUMENTS

| | | | |
|---|---|---|---|
| 3,961,358 | * | 6/1976 | Polinsky ............................. 257/488 |
| 4,825,278 | * | 4/1989 | Hillenius et al. ..................... 257/488 |
| 4,947,222 | * | 8/1990 | Gill et al. ............................. 257/504 |
| 5,861,657 | * | 1/1999 | Ranjan ................................ 257/493 |

OTHER PUBLICATIONS

"A CAD–Compatible SOI/CMOS Gate Array having Body–fixed Partially–Depleted Transistors," Kimio Ueda et al . . . , Digest of Technical Papers, 1997 IEEE International Solid–State Cicuits Conference, pp. 288–289.

* cited by examiner

Primary Examiner—Fetsum Abraham
(74) Attorney, Agent, or Firm—McDermott, Will & Emery

(57) ABSTRACT

A field shield portion consisting of a kind of transistor is formed to electrically insulate an NMOS region of a memory cell from other regions. The field shield portion includes a field shield gate electrode layer, a p type region and a gate insulating film. Threshold value of this transistor is set higher than the power supply voltage, and field gate electrode layer thereof is in a floating state. It is unnecessary to provide a contact portion for applying a prescribed voltage at field shield gate electrode layer. Therefore, the region for forming the contact portion in field shield gate electrode layer can be reduced. As a result, a semiconductor device of which layout area is reduced, is provided.

8 Claims, 7 Drawing Sheets

SOI SEMICONDUCTOR DEVICE WITH FIELD SHIELD ELECTRODE

BACKGROUND OF THE INVENTION

1. Field of the Invention

The present invention relates to a semiconductor device and, more particularly, to a semiconductor device which allows reduction in layout area.

2. Description of the Background Art

A static random access memory (hereinafter referred to as an "SRAM") will be described as an example of a conventional semiconductor device. The SRAM is a volatile semiconductor memory device. In SRAM, memory cell is arranged at each intersection between complementary data lines (bit lines) and word lines arranged in a matrix. FIG. 7 shows an equivalent circuit of a CMOS type memory cell as such memory cell.

Referring to FIG. 7, the memory cell includes a flip-flop circuit F and two access transistors A1 and A2. In flip-flop circuit F, input and output terminals of one inverter consisting of a load element L1 and a driver transistor D1 and of another inverter consisting of a load element L2 and a driver transistor D2 are cross coupled to each other, providing two storage nodes N1 and N2.

Source•drain region of access transistor A1 is connected to storage node N1. Source•drain region of access transistor A1 is connected to one of the complementary bit lines. Similarly, source•drain region of access transistor A2 is connected to storage node N2. Source•drain region of access transistor A2 is connected to the other one of the complementary bit lines. Driver transistor D1 has its drain region connected to source•drain region of access transistor A1. Driver transistor D1 has its source region connected to the ground. Driver transistor D1 has its gate electrode connected to source•drain region of access transistor A2.

Driver transistor D2 has its drain region connected to source•drain region of access transistor A2. Driver transistor D2 has its source region connected to the ground. Driver transistor D2 has its gate electrode connected to source•drain region of access transistor A1.

Load element L1 has one end connected to source•drain region of access transistor A1 and the other end connected to a power supply voltage line (Vcc line). Load element L2 has one end connected to source•drain region of access transistor A2 and the other end connected to the power supply voltage line (Vcc line). Access transistors A1 and A2 have gate electrodes connected to a word line (WL). The word line (WL) controls conduction of access transistors A1 and A2.

Storage nodes N1 and N2 assume two stable states in which a voltage at one storage node is at the high level and a voltage at the other storage node is at a low level or vice versa. Such a stable state is referred to as bistable state. Because of this bistable state, refreshing operation, which is necessary for a DRAM, is unnecessary in the SRAM, which facilitates use of the SRAM.

In the CMOS type memory cell of the SRAM described above, p channel MOS transistors are used for load element L1 and L2, and n channel MOS transistors are used for driver transistors D1 and D2. Further, n channel MOS transistors are used for access transistors A1 and A2.

Therefore, in one memory cell, six MOS transistors are used. The CMOS type memory cell is advantageous in that it has wide operation margin and extremely low data holding current, and therefore the memory cell is suitable for realizing reduction in voltage.

One memory cell has an NMOS region 104 in which n channel MOS transistors are formed, and a PMOS region 106 in which p channel MOS transistors are formed, as shown in FIG. 8. In NMOS region 104, two driver transistors D1 and D2 as well as two access transistors A1 and A2 are formed, as described above. In PMOS region 106, MOS transistors as two load elements L1 and L2 are formed.

NMOS region 104 and PMOS region 106 are electrically insulated by a field shield isolation, respectively. For this purpose, field shield contact portions 108a and 108b for field shield isolation are formed in NMOS region 104 and PMOS region 106. Further, body contact portions 111a and 110b are formed to fix voltages at portions corresponding to channel regions of the MOS transistors formed in NMOS region 104 and PMOS region 106, respectively.

The structure of the memory cell will be described in greater detail in the following. FIG. 9 schematically shows a planar structure in which one n channel MOS transistor and one p channel MOS transistor are formed, for convenience, in NMOS region 104 and PMOS region 106 of FIG. 8. FIG. shows a cross sectional structure taken along the line A-B-C-D-E-F of FIG. 9.

Referring to FIGS. 9 and 10, NMOS region 104 and PMOS region 106 are formed on a silicon substrate 101 with a silicon oxide film 103 interposed. An n channel MOS transistor including a pair of n type source•drain regions 116a and 116b as well a transfer gate electrode 114a is formed in NMOS region 104. Below transfer gate electrode 114a, a channel region 117 at which the channel is formed, is positioned.

Surrounding the MOS transistor, a p type region 120 is formed. The p type region 120 is electrically connected to channel region 117.

Further, in order to stabilize an operation of the n channel MOS transistor, a body contact portion 110a for fixing the voltage of channel region 117 to the ground voltage is formed in p type region 120. On p type region 120, a field shield gate electrode layer 122 is formed with a relatively thin silicon oxide film interposed. A field shield contact portion 108a for fixing the field shield gate electrode layer 122 to the ground voltage is formed in field shield gate electrode layer 122.

In PMOS region 106, a p channel MOS transistor including a pair of p type source•drain regions 118a and 118b as well as a transfer gate electrode 114b is formed. Below transfer gate electrode 114b, a channel region 119 at which the channel is formed, is positioned.

Surrounding the MOS transistor, an n type region 121 is formed. The n type region 121 is electrically connected to channel region 119. Further, a body contact portion 119b for fixing the voltage of channel region 119 at a power supply voltage to stabilize an operation of the p channel MOS transistor is formed in n type region 121. On n type region 121, a field shield gate electrode layer 123 is formed with a relatively thin silicon oxide film interposed. A field shield contact portion 108b for fixing field shield gate electrode layer 123 to the power supply voltage is formed in field shield gate electrode layer 123.

NMOS region 104 and PMOS region 106 are electrically insulated by field shield isolation. On the side of NMOS region 104, by a kind of transistor including p type region 120 and field shield gate electrode 122, field shield gate electrode layer 122 is fixed at the ground voltage, so that the channel region is not formed at p type region 120 below field shield gate electrode layer 122, whereby NMOS region 104 is electrically insulated from other regions.

On the side of PMOS region 106, by a kind of transistor including n type region 121 and field shield gate electrode layer 123, field shield gate electrode layer 123 is fixed at the power supply voltage, so that the channel region is not formed in n type region 121 below field shield gate electrode 123, whereby PMOS region 106 is electrically insulated from other regions. The memory cell of a conventional SRAM has the above described structure.

However, the SRAM described above suffers from the following problems. In the CMOS type SRAM memory cell, six MOS transistors are used per one memory cell. Therefore, though the memory cell is advantageous in that it has wide operation margin and is suitable for reducing voltage, it is disadvantageous that the area occupied by the memory cell is large as compared with other type memory cells such as a high resistance load type memory cell. The high resistance load type memory cell refers to a memory cell which utilizes a high resistance element as a load element in the memory cell.

Further, in the CMOS type SRAM memory cell, two field shield contact portions are formed for every memory cell, in order to electrically insulate NMOS and PMOS regions in the memory cell. Further, in order to stabilize operations of MOS transistors formed in the NMOS and PMOS regions respectively, two body contact portions are formed in every memory cell. Accordingly, in the CMOS type SRAM memory cell, in addition to the region for forming 6 MOS transistors, a region for forming the above described four contact portions is necessary for each memory cell. Therefore, it has been difficult to overcome the disadvantage that the area occupied by the CMOS type memory cell in the SRAM layout is larger than the area occupied by a memory cell of a different type.

SUMMARY OF THE INVENTION

The present invention was made to solve the above described problem, and each object is to provide a semiconductor device which facilitates reduction in layout area of the semiconductor device.

According to one aspect of the present invention, the semiconductor device includes a semiconductor substrate, a first insulating film, a semiconductor element forming region and a field shield portion. The semiconductor substrate has a main surface. The first insulating film is formed on the main surface of the semiconductor substrate. The semiconductor element forming region is formed on a surface of the first insulating film. The field shield portion is formed on the surface of the first insulating film and electrically insulates the semiconductor element forming region from other regions. The field shield portion includes a first impurity region of a first conductivity type formed on the surface of the first insulating film to surround the semiconductor element forming region, and an electrode layer formed on the first impurity region with a second insulating film interposed. An absolute value of a voltage to be applied to the electrode layer to form an inversion layer of a second conductivity type in the first impurity region is set higher than the power supply voltage for driving the semiconductor element formed in the semiconductor element forming region. The electrode layer is in a floating state.

In this structure, the semiconductor element forming region is electrically insulated by the field shield portion from other regions. In the field shield portion, the threshold voltage of a kind of transistor including the first impurity region, the second insulating film and the electrode layer is set higher than the power supply voltage for driving the semiconductor element. Here, the electrode layer of this transistor is at the floating state, and therefore when the semiconductor device is in operation, the voltage of the electrode layer is between the power supply voltage for driving the semiconductor element and the ground voltage. Accordingly, even when the semiconductor device is in operation, the aforementioned kind of transistor is off, and therefore the channel region is not formed in the first impurity region. Therefore, the semiconductor element forming region can be electrically insulated from other regions. In other words, it is possible to electrically insulate the semiconductor element forming region from other regions without providing the contact portion for applying a prescribed voltage in the electrode layer. Therefore, a region for providing the contact portion can be eliminated from the electrode layer, and accordingly, layout area of the semiconductor device can easily be reduced.

In the semiconductor forming region, a transistor including a second impurity region of the first conductivity type of a prescribed width electrically connected to the first impurity region, a pair of third impurity regions of the second conductivity type formed on opposing sides of the second impurity region and a gate electrode formed on a surface of the second impurity region with a third insulating film interposed, may be formed as the semiconductor element. Desirably, in the first impurity region of the field shield portion, a body contact portion is formed to fix the second impurity region to the power supply voltage or the ground voltage. In that case, the voltage of the second impurity region is fixed, and the operation of the transistor is stabilized.

Further, a plurality of semiconductor element forming regions insulated from each other by the field shield portion may preferably be formed as a unit, and in each unit, the first impurity regions are preferably electrically connected to each other and one body contact portion is formed.

In this case, a region for providing the body contact portion for every semiconductor element forming region can be reduced, and therefore layout area of the semiconductor device including transistors can be reduced.

According to another aspect of the present invention, the semiconductor device includes a semiconductor substrate, a first insulating film, a semiconductor element forming region and a field shield portion. The semiconductor substrate has a main surface. The first insulating film is formed on the main surface of the semiconductor substrate. The semiconductor element forming region is formed on a surface of the first insulating film. The field shield portion includes a first impurity region of a first conductivity type formed on the surface of the first insulating film, and an electrode layer formed on the first impurity region with a second insulating film interposed, and is formed to surround the semiconductor element forming region. A plurality of semiconductor element forming regions insulated from each other by the field shield portion are provided as a unit, and in each unit, the electrode layers of the field shield portions are electrically connected to each other, and one field shield contact portion is formed to fix the electrode layer to the ground voltage or to a power supply voltage for driving the semiconductor element formed in the semiconductor element forming region.

In this structure, the semiconductor element forming regions in the unit are electrically insulated from each other by the field shield portion including an electrode layer to which a prescribed voltage is applied from the field shield contact portion. Therefore, as compared with an example in which the field shield contact portion is formed in every semiconductor element forming region, the region for forming the field shield contact portion in the electrode layer can be reduced and therefore, the layout area of the semiconductor device can be reduced.

Preferably, in the field shield portion, the absolute value of the voltage to be applied to the electrode layer to form an inversion layer of a second conductivity type in the first impurity region is set higher than the power supply voltage.

In this case, even when the voltage of the electrode layer fluctuates, the aforementioned kind of transistor is not turned from off to on, and the channel region is not formed in the first impurity region. Therefore, the semiconductor element forming regions are electrically insulated effectively from other regions, respectively.

In the semiconductor element forming region, a transistor including a second impurity region of the first conductivity type of a prescribed width electrically connected to the first impurity region, a pair of third impurity regions of the second conductivity type formed on opposing sides of the second impurity region, and a gate electrode formed on the surface of the second impurity region with a third insulating film interposed, may be formed as the semiconductor element. In the unit, the first impurity regions are electrically connected to each other, and one body contact portion is formed to fix the second impurity region to the power supply voltage or to the ground voltage.

In this case, the voltage of the second impurity region is fixed and the operation of the transistor is stabilized. Further, the area for providing the body contact portion for every semiconductor element forming region can be reduced, and layout area of the semiconductor device including transistors can be reduced.

Further, the unit may include two semiconductor element forming regions and in the unit, one field shield contact portion may be formed in a field shield portion surrounding one semiconductor element forming region, and one body contact portion may be formed in the field shield portion surrounding the other semiconductor element forming region. In this case also, the layout area of the semiconductor device can be reduced easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
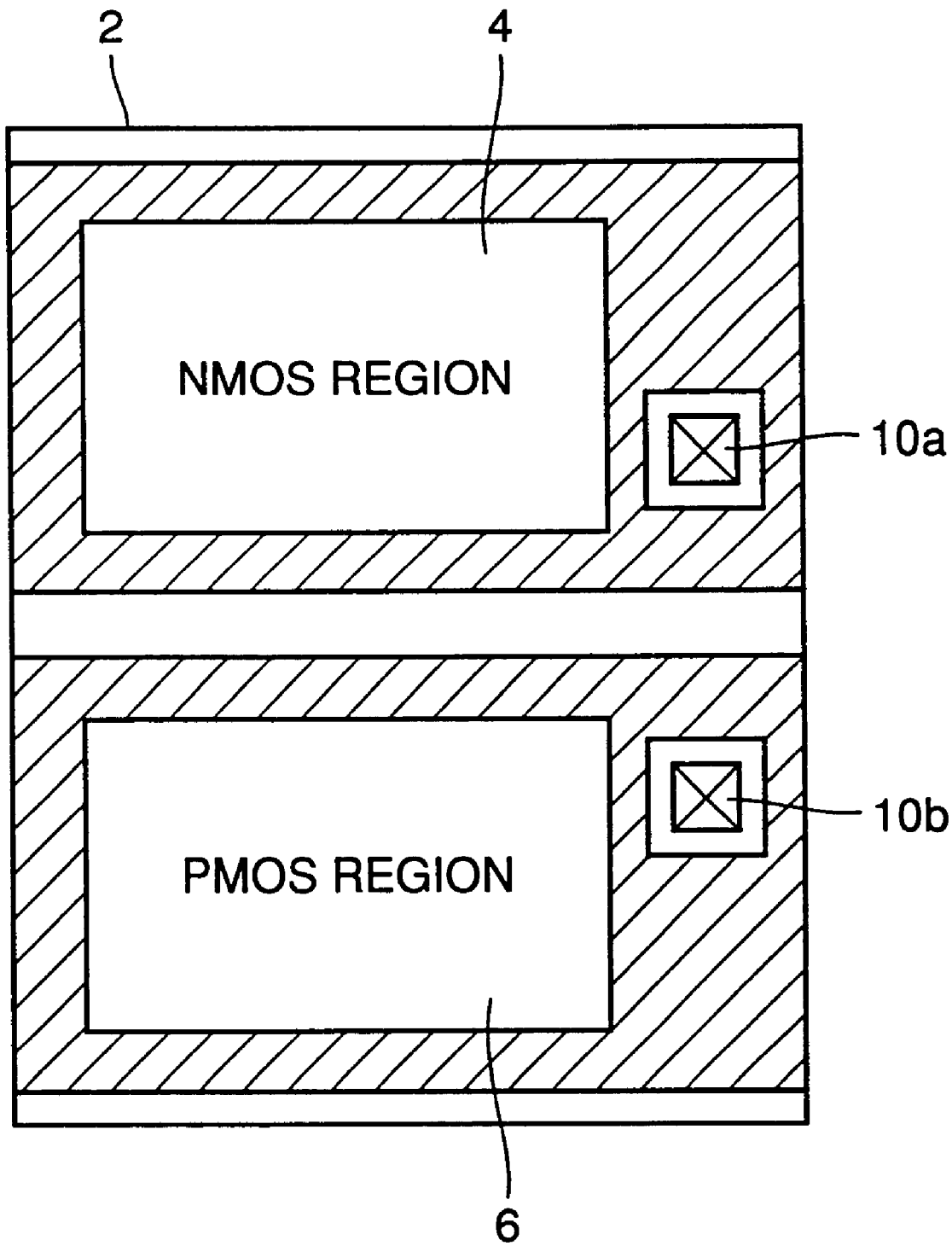
FIG. 1 is a schematic diagram showing a planar structure of one memory cell in an SRAM in accordance with one embodiment of the present invention.
Figure 7:
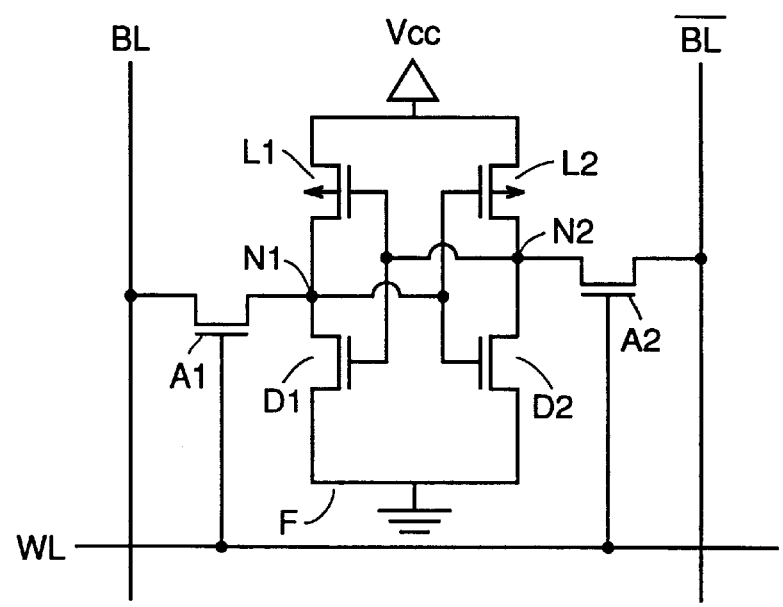
FIG. 7 shows an equivalent circuit of a memory cell in the SRAM.
Figure 8:
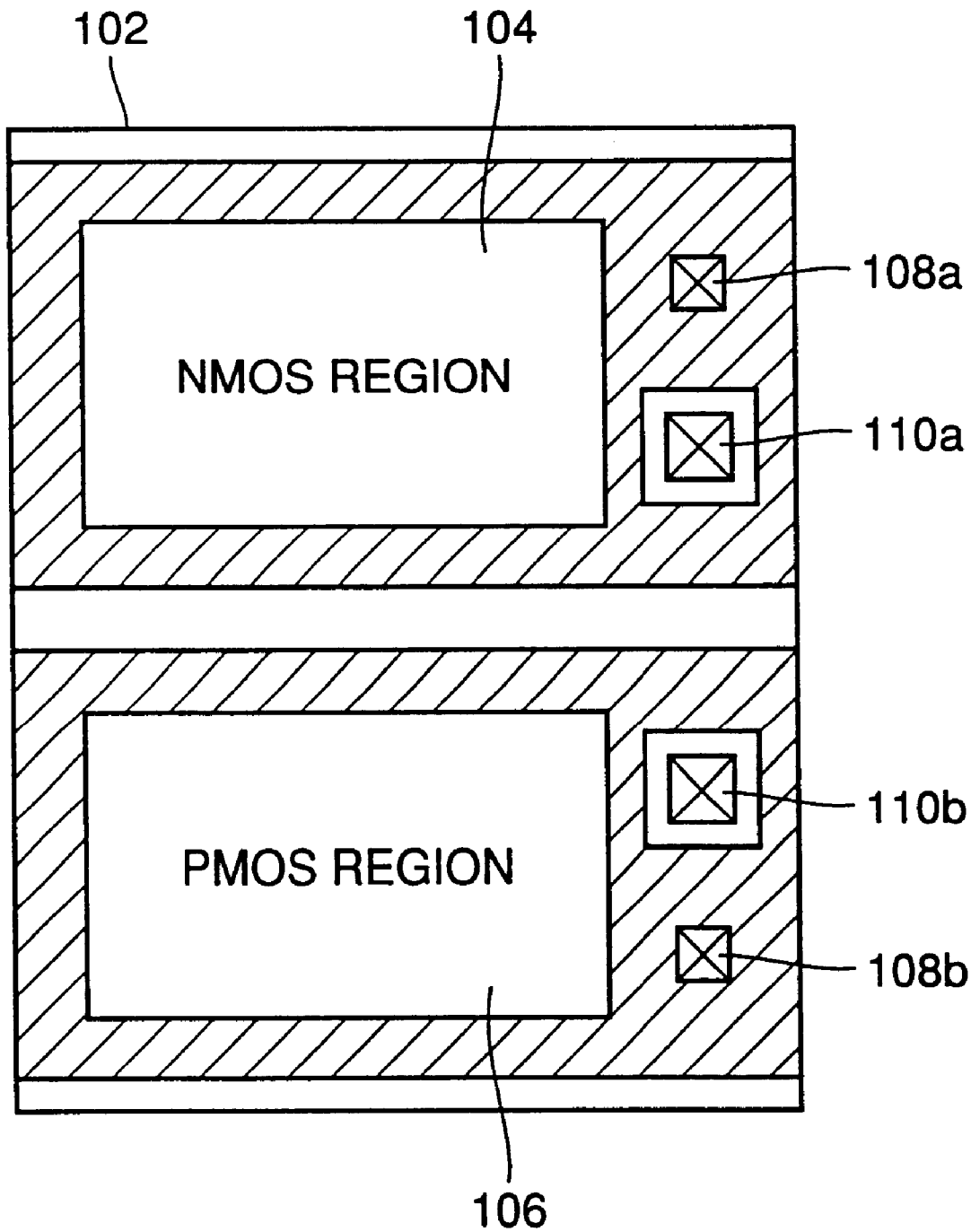
FIG. 8 is a diagram showing a planar structure of one memory cell of a conventional SRAM.
Figure 9:
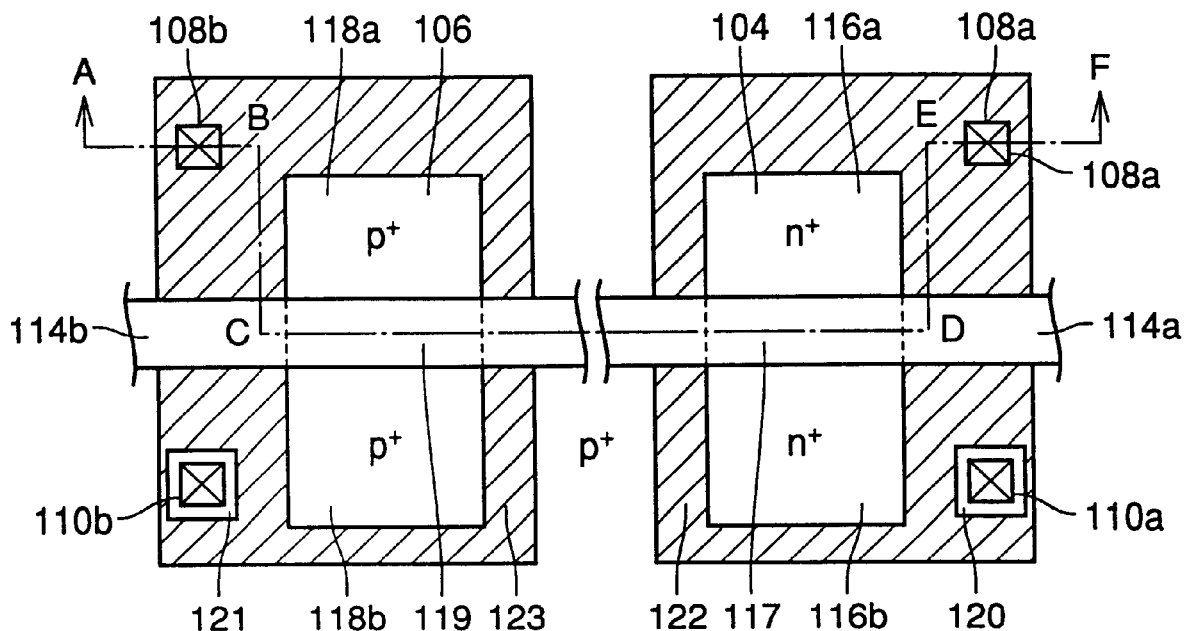
FIG. 9 is another diagram showing planar structure of one memory cell of the conventional SRAM.
Figure 10:
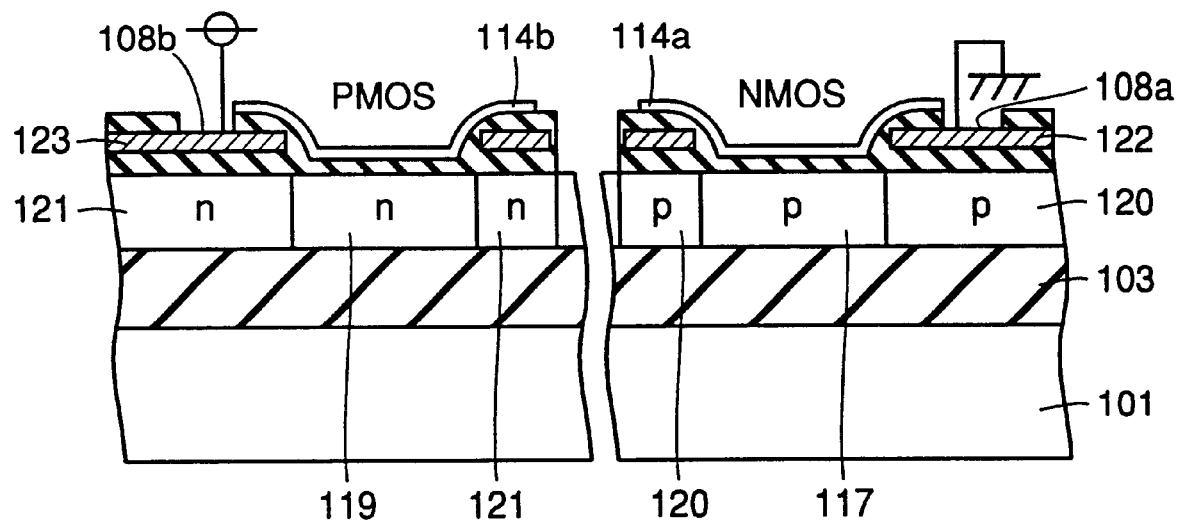
FIG. 10 shows a cross sectional structure of the memory cell shown in FIG. 9.

A semiconductor device in accordance with a first embodiment of the present invention will be described. FIG. 1 shows a planar structure of one memory cell in a CMOS type SRAM. The equivalent circuit of one memory cell is the same as that shown in FIG. 7. Referring to FIGS. 1 and 7, in one memory cell, driver transistors D1 and D2 and access transistors A1 and A2 are n channel MOS transistors. These four n channel MOS transistors are formed in NMOS region 4.

Load elements L1 and L2 are p channel MOS transistors. These two p channel MOS transistors are formed in PMOS region 6. A number of such memory cells are formed on a semiconductor substrate, constituting one SRAM.

In one memory cell, NMOS region 4 and PMOS region 6 are electrically insulated by field shield isolation, respectively. In NMOS region 4 and PMOS region 6, body contact portions 10a and 10b are formed respectively, to fix the channel region at a prescribed voltage in order to stabilize operations of the MOS transistors formed in respective regions 4 and 6.

Figure 2:
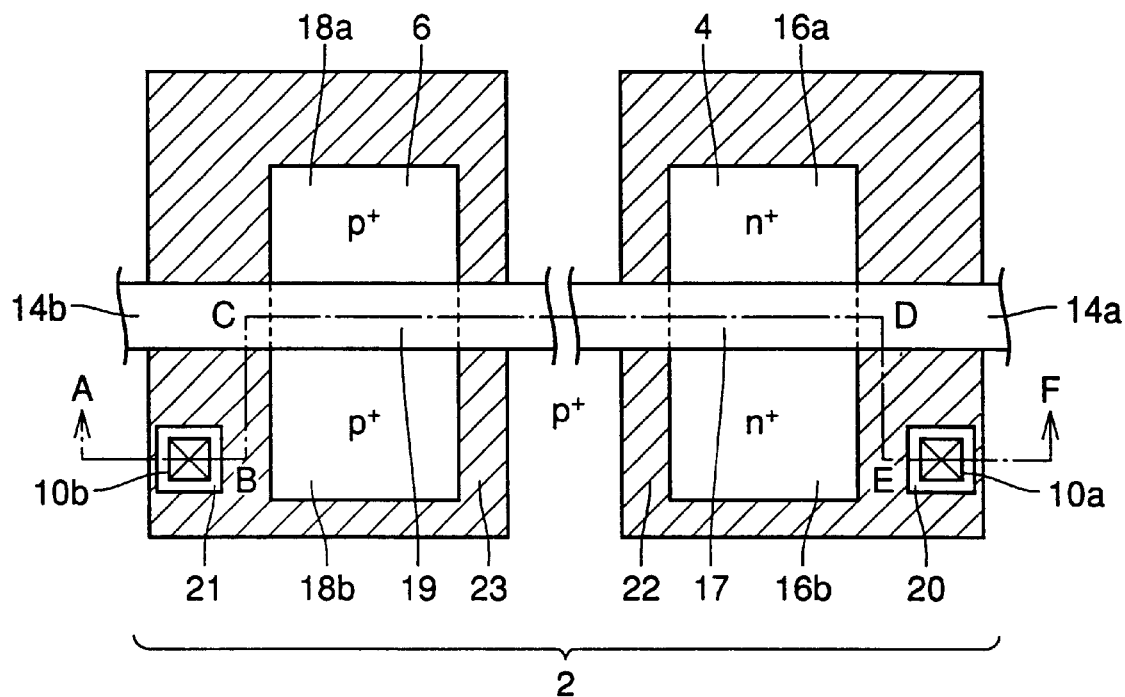
FIG. 2 is another schematic diagram showing a planar structure of one memory cell of the SRAM of the same embodiment.
Figure 3:
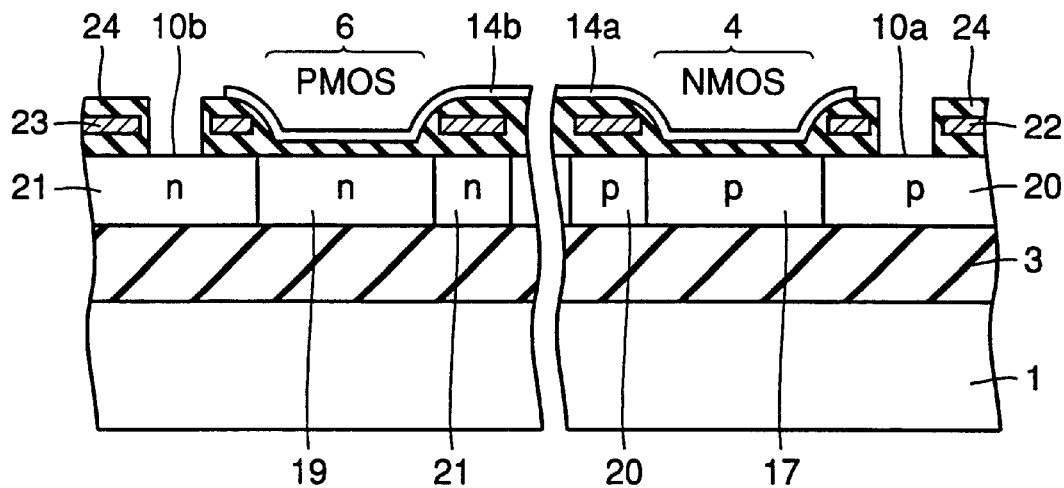
FIG. 3 shows a cross sectional structure of the memory cell shown in FIG. 2 in accordance with the same embodiment.

The memory cell structure will be described in greater detail. FIG. 2 schematically shows a planar structure of one n channel MOS transistor and one p channel MOS transistor formed respectively in NMOS region and PMOS region 6 of FIG. 1, for convenience of description. FIG. 3 shows a cross sectional structure taken along the line A-B-C-D-E-F of FIG. 2.

Referring to FIGS. 2 and 3, NMOS region 4 and PMOS region 6 are formed on a silicon substrate 1 with a silicon oxide film 3 interposed. In NMOS region 4, an n channel MOS transistor including a pair of n type source•drain regions 16a and 16b and a transfer gate electrode 14a is formed. Below transfer gate electrode 14a, a channel region 17 is arranged. Surrounding the MOS transistor, a p type region 20 is formed on silicon oxide film 3. The p type region 20 is electrically connected to channel region 17. In p type region 20, body contact portion 10a for fixing the voltage of channel region 17 to the ground voltage is formed. On p type region 20, a field shield gate electrode layer 22 is formed with a gate insulating film 24 such as a silicon oxide film, interposed. The p type region 20, gate insulating film 24 and field shield gate electrode layer 22 constitute the field shield portion.

In PMOS region 6, a p channel MOS transistor including a pair of p type source•drain regions 18a, 18b and a transfer gate electrode 14b is formed. Below transfer gate electrode 14b, channel region 19 is arranged. Surrounding the MOS transistor, an n type region 21 is formed on silicon oxide film 3. On the n type region 21, a field shield gate electrode layer 23 is formed with a gate insulating film 24 such as a silicon oxide film, interposed. The n type region 21, gate insulating film 24 and field shield gate electrode layer 23 constitute the field shield portion.

The p type region 20 and the n type region 21 may be SOI (Silicon On Insulator) layers.

NMOS region 4 and PMOS region 6 are electrically insulated from each other by the field shield portions. On the side of NMOS region, the field shield portion consists of a kind of transistor including p type region 20, gate insulating film 24 and field shield gate electrode layer 22. The threshold voltage of this transistor is set higher than the power supply voltage for driving the n channel MOS transistors formed in NMOS region. To field shield gate electrode layer 22 of this transistor, the field shield contact portion for fixing field shield gate electrode layer 22 to the ground voltage is not provided. In other words, the field shield gate electrode layer 22 is in a floating state. Therefore, the voltage of field shield gate electrode layer 22 is between the power supply voltage and the ground voltage. Accordingly, even when the SRAM is in operation, the aforementioned kind of transistor is off, an inversion layer (channel region) is not formed in p type region 20, and therefore NMOS region 4 can be electrically insulated from other regions.

On the side of PMOS region 6, the field shield portion consists of a kind of transistor including n type region 21, gate insulating film 24 and field shield gate electrode layer 23. The threshold voltage of this transistor is also higher than the power supply voltage. Further, the field shield contact portion is not formed in field shield gate electrode layer 23, either, and the field shield gate electrode layer is in the floating state. Therefore, similar to the aforementioned kind of transistor formed in NMOS region 4, an inversion layer (channel region) is not formed in n type region 21, and therefore PMOS region 6 can be electrically insulated from other regions.

Assuming that the power supply voltage of the SRAM is 3.3 V, the absolute value of the threshold voltage of the aforementioned kind of transistor can be made higher than the power supply voltage by setting thickness of the gate insulating film to be 20 nm or thicker, when impurity concentration of the n type or p type region below the field shield gate electrode layer is about $5 \times 10^{17}/cm^3$.

In this manner, different from the conventional memory cell, NMOS region 4 and PMOS region 6 can be electrically insulated from other regions without providing the field shield contact portions for fixing field shield gate electrode layers 22 and 23 to prescribed voltages, respectively. As a result, in the NMOS and PMOS regions of each memory cell, the region for providing the field shield contact portion in the field shield gate electrode layer can be reduced, and therefore, layout area of the SRAM can be reduced easily.

Further, it is not necessary to form a metal interconnection for electrically connecting field shield contact portions to each other, and therefore degree of freedom of metal interconnection pattern is also increased.

Second Embodiment

Figure 4:
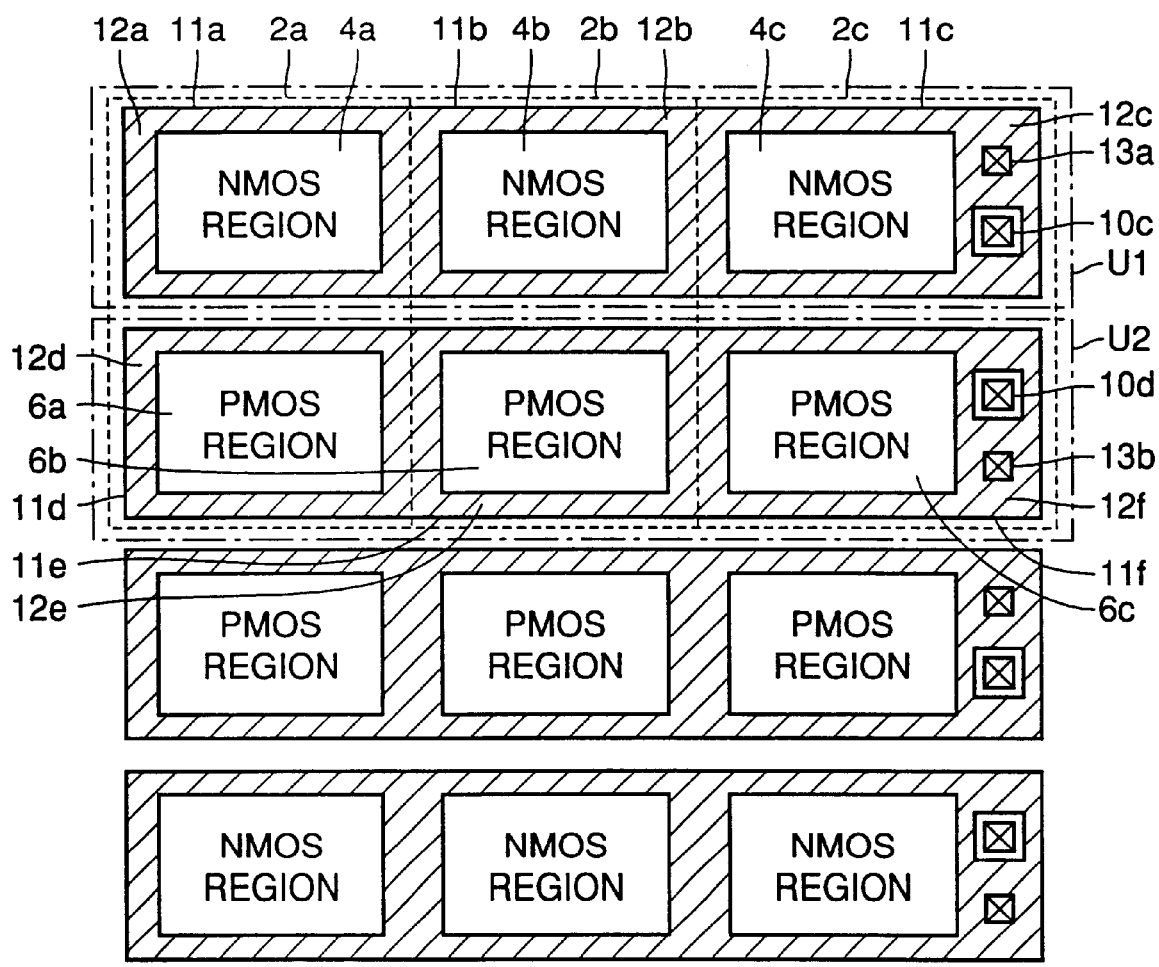
FIG. 4 is a schematic diagram showing a planar structure of a memory cell of an SRAM in accordance with a second embodiment.

A semiconductor layer in accordance with a second embodiment of the present invention will be described. FIG. 4 shows a planar structure of six (3×2) memory cell portions extracted from the memory cells of the SRAM. Referring to FIG. 4, one memory cell 2a includes, as already described, an NMOS region 4a and a PMOS region 6a, for example. NMOS region 4a and PMOS region 6a are electrically insulated from other regions by field shield regions 11a and 11b. A region including NMOS regions 4a, 4b and 4c of memory cells 2a, 2b and 2c is formed as one unit U1.

In unit U1, field shield gate electrode layers 12a, 12b and 12c of field shield portions 11a, 11b and 11c are electrically connected to each other. The p type regions (not shown) formed below field shield gate electrode layers 12a, 12b and 12c, respectively, are electrically connected to each other.

Similarly, a region including PMOS regions 6a, 6b and 6c of memory cells 2a, 2b and 2c is formed as one unit U2. In unit U2, field shield gate electrode layers 12d, 12e and 12f are electrically connected to each other. The n type regions (not shown) formed below field shield gate electrode layers 12d, 12e and 12f respectively are electrically connected to each other.

In unit U1, specifically at field shield gate electrode layer 12c, one field shield contact portion 13a is formed for fixing field shield gate electrode layers 12a, 12b and 12c to the ground voltage. Though field shield contact portion 13a is formed in field shield gate electrode layer 12c, it is not provided in field shield gate electrode layers 12a and 12b. Therefore, field shield gate electrode layers 12a, 12b and 12c tend to fluctuate from the ground voltage.

In unit U2, a field shield contact portion 13b for fixing field shield gate electrode layers 12d, 12e and 12f to the power supply voltage is formed in field shield gate electrode layer 12f. Though field shield contact portion 13b is formed in field shield gate electrode layer 12f, it is not formed in field shield gate electrode layers 12d and 12e. Therefore, field shield gate electrode layers 12d, 12e and 12f tend to fluctuate from the power supply voltage.

However, in the field shield portions 11a, 11b and 11c, the transistors of a kind provided including field shield gate electrode layers 12a, 12b, 12c, gate insulating films (not shown) and p type regions (not shown) respectively have the threshold voltage to be applied to the field shield gate electrode layer for forming an inversion layer (channel region) in the p type region is set higher than the power supply voltage.

Similarly, in the transistor of a kind formed including field shield gate electrode layers 12d, 12e, 12f, gate insulating films (not shown) and n type regions (not shown) in field shield portions 11d, 11e and 11f, respectively, the absolute value of the threshold value to be applied to the field shield gate electrode layer to form an inversion layer (channel region) in the n type region is set higher than the power supply voltage.

Accordingly, even when field shield gate electrode layers 12a, 12b and 12c fluctuate from the ground voltage, the inversion layer is not formed in respective p type regions, and therefore the above described transistors can be kept off.

Even when field shield gate electrode layers 12d, 12e and 12f fluctuate from the power supply voltage, the inversion layer is not formed in respective n type regions, and the above described kind of transistors can be kept off. As a result, NMOS regions 4a, 4b and 4c as well as PMOS regions 6a, 6b and 6c can each be electrically insulated from other regions.

Further, a body contact portion 10c is formed in the p type region below field shield gate electrode layer 12c. Similar to field shield contact portion 13a, body contact portion 10c is not formed in p type regions below field shield gate electrode layers 12a and 12b. However, the regions serving as channel regions of n type MOS transistors respectively are electrically connected to p type regions formed below field shield gate electrode layers 12a, 12b and 12c, respectively, and further, the p type regions are electrically connected to each other. Accordingly, the region which serves as the channel region of respective ones of the n channel MOS transistor can be fixed at the ground voltage, and therefore the operation of the n channel MOS transistor is stabilized.

A body contact portion 10d is formed in the n type region below field shield gate electrode layer 12f Similar to field shield contact portion 13b, body contact portion 10d is not formed in the n type regions below field shield gate electrode layers 12d, 12e and 12f However, the regions to be the channel regions of respective p channel MOS transistors are electrically connected to the n type regions formed below field shield gate electrode layers 12d, 12e and 12f, respectively, and respective n type regions are electrically connected to each other. Therefore, the regions to be the channel regions of respective p channel MOS transistors can be fixed at the power supply voltage, and hence the operation of the p channel MOS transistor is stabilized.

In the SRAM memory cell described above, a region including three NMOS regions 4a, 4b and 4c and field shield portions 11a, 11b and 11c of three memory cells is considered as one unit U1, and a region including three PMOS regions 6a, 6b and 6c and field shield portions 11d, 11e and 11f is considered one unit U2. For unit U1, one field shield contact portion 13a and one body contact portion 10c are formed. For unit U2, one field shield contact portion 13b and one body contact portion 10d are formed.

Accordingly, as compared with the device in which two field shield contact portions and two body contact portions are formed in every memory cell, the region for forming the field shield contact portion and the body contact portion can be reduced. The effect of reduction is especially felt in memory cells having a plurality of repeated patterns, and layout area of the SRAM as a whole can be reduced easily.

Further, it is unnecessary to provide a metal interconnection for electrically connecting the field shield contact portions. Therefore, degree of freedom of the metal interconnection pattern is improved.

Though a region including NMOS regions of three memory cells or PMOS regions of three memory cells has been described as one unit, it is not limiting.

Third Embodiment

The semiconductor device in accordance with a third embodiment will be described. In the second embodiment, an SRAM has been described as an example in which one field shield contact portion and one body contact portion are formed for one unit. In the present embodiment, description will be made on an example in which a field shield contact portion and a body contact portion are formed alternately in a repeated pattern of memory cells.

Figure 5:
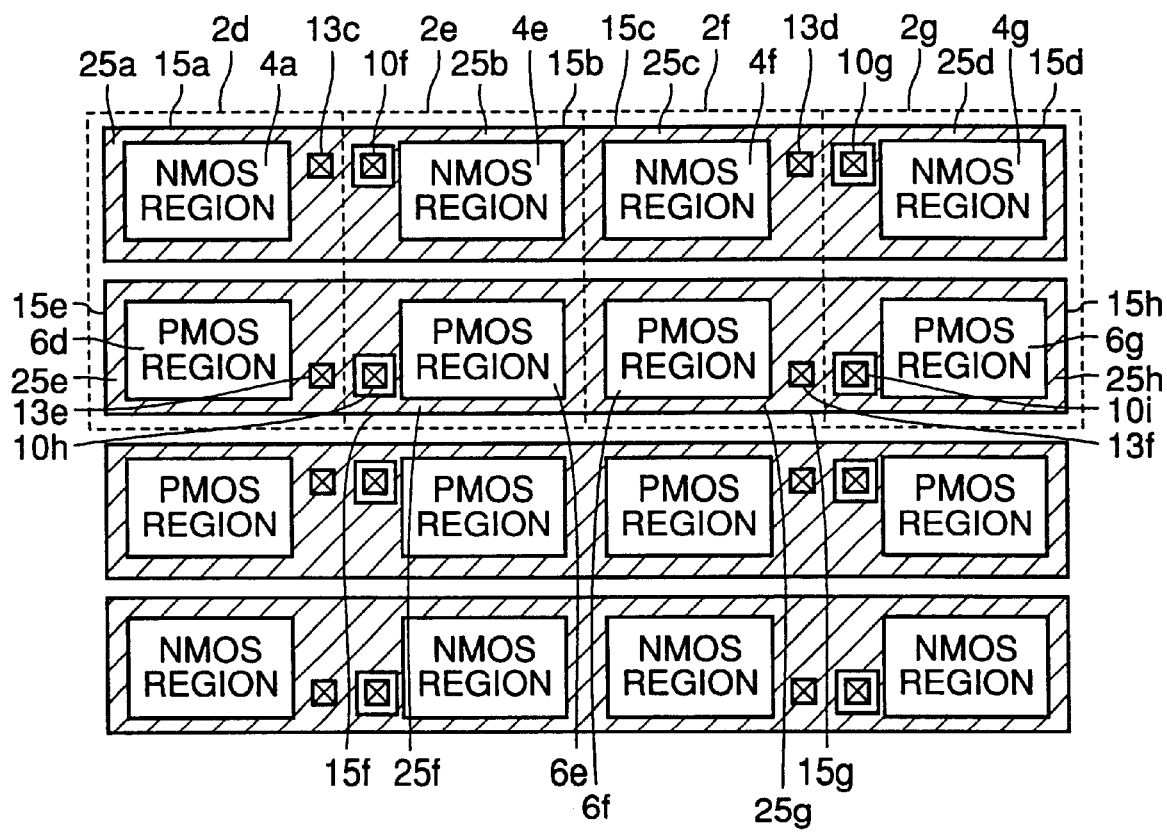
FIG. 5 is a schematic diagram showing a planar structure of a memory cell of an SRAM in accordance with a third embodiment of the present invention.

FIG. 5 shows a planar structure of eight (4×2) memory cell portions extracted from the SRAM memory cells. Referring to FIG. 5, NMOS regions 4d, 4e, 4f and 4g and PMOS regions 6d, 6e, 6f and 6g of memory cells 2d, 2e, 2f and 2g are each electrically insulated from other regions by field shield portions 15a to 15h.

Field shield gate electrode layers 25a to 25d of field shield portions 15a to 15d are electrically connected to each other. Further, p type regions (not shown) formed below field shield gate electrode layers 25a to 25d, respectively, are also electrically connected to each other. Field shield contact portions 13c and 13d are formed in field shield gate electrode layers 25a and 25c for fixing field shield gate electrode layers 25a to 25d to the ground voltage, respectively. Further, body contact portions 10f and 10g are formed in p type regions below field shield gate electrode layers 25b and 25d, respectively. More specifically, in a repeated pattern including NMOS regions and field shield portions of the memory cells, the field shield contact portions and the body contact portions are formed repeated alternately.

In this structure, when two NMOS regions are regarded as one unit, one field shield contact portion is formed on the side of one NMOS region and the body contact portion is formed on the side of the other NMOS region in the unit.

Similarly, field shield gate electrode layers 25e to 25h of field shield portions 15e to 15h are electrically connected to each other. Further, n type regions (not shown) formed below field shield gate electrode layers 25e to 25h are electrically connected to each other. Field shield contact portions 13e and 13f for fixing field shield gate electrode layers 25e to 25h to the power supply voltage are formed in field shield gate electrode layers 25e and 25g, respectively. Body contact portions 10h and 10i are formed n type regions below field shield gate electrode layers 25f and 25h, respectively.

More specifically, in the repeated pattern of PMOS regions and field shield portions of the memory cells, the field shield contact portion and the body contact portion are repeatedly formed alternately.

Figure 6:
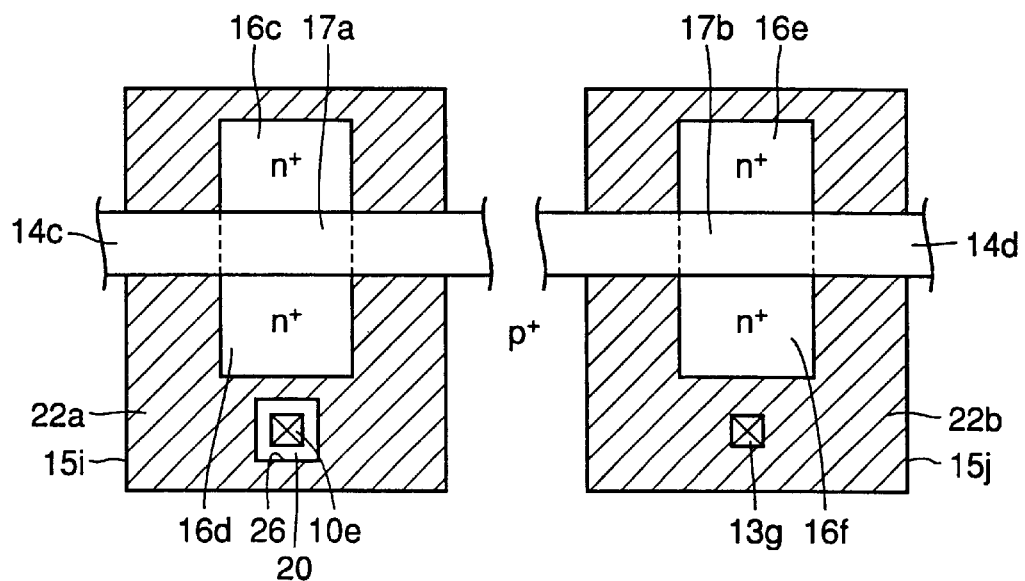
FIG. 6 is another diagram showing a planar structure of the memory cell shown in FIG. 5 in accordance with the same embodiment.

The structure of the basic repeated pattern of the memory cells will be described in greater detail. FIG. 6 shows a planar structure of NMOS regions with a body contact portion formed and a field shield contact portion formed, respectively, in each memory cell shown in FIG. 5. For convenience of description, in the example shown in FIG. 6, it is assumed that one n channel MOS transistor is formed in the NMOS region.

Referring to FIG. 6, field shield portion 15i is formed to surround an n channel MOS transistor including a pair of source•drain regions 16c, 16d and transfer gate electrode 14c. In field shield gate electrode layer 22a of field shield portion 15i, an opening 26 is formed, exposing a surface of a p type region. Body contact portion 10e is formed in the p type region.

Field shield portion 15j is formed to surround an n channel MOS transistor including a pair of source•drain regions 16e, 16f and transfer gate electrode 14d. In field shield gate electrode layer 22b of field shield 15j, field shield contact portion 13g is formed. In an NMOS region, ground voltage is applied to both body contact portion 10e and field shield contact portion 13g. In a PMOS region, the power supply voltage is applied to both the body contact portion and the field shield contact portion.

Therefore, when a field shield contact portion is to be formed in NMOS regions of adjacent two memory cells and an opening is formed in the field shield gate electrode layer corresponding to that position in advance, the contact portion serves as a body contact portion. If there is not such an opening in the field shield gate electrode layer, the contact portion serves as the field shield contact portion.

In this manner, dependent on whether an opening is formed in advance in the field shield gate electrode layer or not, a body contact portion or a field shield contact portion can be formed easily. This also applies to the PMOS region of the memory cell. In the PMOS region, the power supply voltage is applied to the body contact portion and the field shield contact portion.

In this manner, as compared with the device in which two field shield contact portions and two body contact portions are formed per one memory cell, one field shield contact portion and one body contact portion can be reduced. Therefore, in memory cells having a plurality of repeated patterns, the effect of reducing the region for forming the field shield contact portion and the body contact portion is significant, and the layout area of the SRAM as a whole can be reduced easily.

Further, it is unnecessary to form a metal interconnection to electrically connect the field shield contact portions and the body contact portions, and therefore degree of freedom of the metal interconnection pattern is also improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate having a main surface;

a first insulating film formed on the main surface of said semiconductor substrate;

a semiconductor element forming region formed on a surface of said first insulating film; and a field shield portion formed on the surface of said first insulating film for electrically insulating said semiconductor element forming region from other regions, said field shield portion including a first impurity region of a first conductivity type formed on the surface of said first insulating film to surround said semiconductor element forming region, and an electrode layer formed on said first impurity region, with a second insulating film interposed, so as to surround the semiconductor element forming region, an absolute value of a voltage to be applied to said electrode layer to form an inversion layer of a second conductivity type in said first impurity region being higher than a power supply voltage for driving a semiconductor element formed in said semiconductor element forming region, and said electrode layer being in a floating state.

2. The semiconductor device according to claim 1, wherein said semiconductor element forming region has a transistor formed therein including a second impurity region of the first conductivity type of a prescribed width electrically connected to said first impurity region, a pair of third impurity regions of the second conductivity type formed on opposing sides of said second impurity region, and a gate electrode formed on a surface of said second impurity region with a third insulating film interposed; and a body contact portion for fixing said second impurity region to said power supply voltage or a ground voltage is formed in said first impurity region of said field shield portion.

3. The semiconductor device according to claim 2, wherein a plurality of said semiconductor element forming regions insulated from each other by a plurality of said field shield portions constitute a unit, and in said unit, said first impurity regions of said plurality of field shield regions are electrically connected to each other and one said body contact portion.

4. A semiconductor device, comprising:

a semiconductor substrate having a main surface;

a first insulating film formed on the main surface of said semiconductor substrate;

a plurality of semiconductor element forming regions formed on a surface of said first insulating film; and a plurality of field shield portions formed on the surface of said first insulating film for insulating said plurality of semiconductor element forming regions from each other; wherein said plurality of said semiconductor element forming regions insulated from each other by said plurality of field shield portions constitute a unit;

each of said plurality of field shield portions includes a first impurity region of a first conductivity type formed on the surface of said first insulating film to surround said semiconductor element forming region, and an electrode layer formed on said first impurity region with a second insulating film interposed; and in said unit, said electrode layers of said field shield portions are electrically connected to each other, and one field shield contact portion for fixing said electrode layers electrically connected to each other to a ground voltage or a power supply voltage for driving a semiconductor element formed in said semiconductor element forming region is formed in said electrode layer of one of said plurality of field shield portions.

5. The semiconductor device according to claim 4, wherein an absolute value of a voltage to be applied to said electrode layer to form an inversion layer of a second conductivity type in said first impurity region is higher than said power supply voltage.

6. The semiconductor device according to claim 5, wherein said semiconductor element forming region includes a transistor including a second impurity region of the first conductivity type of a prescribed width electrically connected to said first impurity region, a pair of third impurity regions of a second conductivity type formed on opposing sides of said second impurity region, and a gate electrode formed on a surface of said second impurity region with a third insulating film interposed; and in said unit, said first impurity regions are electrically connected to each other, and a body contact portion for fixing said second impurity region to said power supply voltage or the ground voltage is formed.

7. The semiconductor device according to claim 6, wherein said unit includes two said semiconductor element forming regions, and in said unit, one said field shield contact portion is formed at said field shield portion surrounding one of said semiconductor element forming regions, and one said body contact portion is formed at said field shield portion surrounding the other one of said semiconductor element forming regions.

8. A semiconductor device, comprising:

a semiconductor substrate having a main surface;

a first insulating film formed on the main surface of said semiconductor substrate;

a plurality of semiconductor element forming regions formed on a surface of said first insulating film;

a transistor formed in each of said plurality of semiconductor element forming regions; and a plurality of field shield portions formed on the surface of said first insulating film for electrically insulating said semiconductor element forming regions from each other; wherein said plurality of semiconductor element forming regions insulated from each other by said plurality of field shield portions constitute a unit;

each of said plurality of field shield portions include a first impurity region of a first conductivity type formed on the surface of said first insulating film to surround said semiconductor element forming region, and an electrode layer formed on said first impurity region with a second insulating film interposed, an absolute value of a voltage to be applied to said electrode layer to form an inversion layer of a second conductivity type in said first impurity region being higher than a power supply voltage for driving a semiconductor element formed in said semiconductor element forming region, and said electrode layer being in a floating state;

said transistor includes a second impurity region of the first conductivity type of a prescribed width electrically connected to said first impurity region, a pair of third impurity regions of the second conductivity type formed on opposing sides of said second impurity region, and a gate electrode formed on a surface of said second impurity region with a third insulating film interposed;

in said unit, said first impurity regions of said plurality of field shield regions are electrically connected to each other, and a body contact portion for fixing said second impurity region to said power supply voltage or a ground voltage is formed in said first impurity region of one of said plurality of field shield portions.

* * * * *